United States Patent [19]

Buckley

[11] 4,114,982
[45] Sep. 19, 1978

[54] SCREENS SUITABLE FOR USE IN PHOTO-ENGRAVING AND PHOTO-LITHOGRAPHIC PROCESSES AND IN COLOR TELEVISION

[76] Inventor: Raymond Buckley, 13 Church St., Wood Ln., Bignall, Stoke-on-Trent, Staffordshire, England

[21] Appl. No.: 677,154

[22] Filed: Apr. 15, 1976

[51] Int. Cl.² .............................................. G03B 21/60
[52] U.S. Cl. ........................................ 350/127; 96/38; 96/45; 355/71
[58] Field of Search ................... 355/71; 358/55, 245, 358/247, 237, 250, 253; 350/167, 169, 170, 127, 128; 96/38, 45, 116; 240/93

[56] References Cited

U.S. PATENT DOCUMENTS

| | | | |
|---|---|---|---|
| 1,610,423 | 12/1926 | Cawley | 350/127 X |
| 2,588,373 | 3/1952 | Erban | 350/127 |
| 3,068,754 | 12/1962 | Benjamin | 350/127 X |
| 3,258,341 | 6/1966 | Riemerschmid et al. | 96/116 |
| 3,671,101 | 6/1972 | Finch | 240/93 X |
| 3,737,321 | 6/1973 | Torr et al. | 96/116 |

*Primary Examiner*—Richard A. Wintercorn
*Attorney, Agent, or Firm*—Marshall & Yeasting

[57] ABSTRACT

This invention is concerned with light transmitting screens which can be used in printing of half-tone illustrations such as photographs and in color television. The screen is formed on one face with a plurality of projections or depressions which so adjoin one another that the face is free of interstices, light incident on the contoured surface so formed being refracted as it passes through the screen to break up the image being transmitted into a pattern of dots. For use in color television, the projections or depressions are defined as triangular pyramids whose surfaces are subtended from their bases at different angles to be in sympathy with the wavelengths of the different colors being transmitted.

13 Claims, 1 Drawing Figure

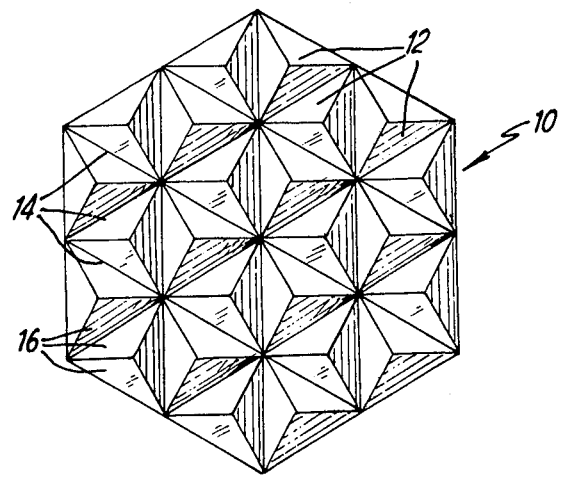

SCREENS SUITABLE FOR USE IN PHOTO-ENGRAVING AND PHOTO-LITHOGRAPHIC PROCESSES AND IN COLOR TELEVISION

This invention relates to light-transmitting screens for use in printing of half-tone illustrations such as photographs particularly in photo-engraving and photo-lithographic processes, and for use in colour television.

In printing, it is necessary to convert half-tone illustrations, such as photographs into a printable form by breaking up the image into a pattern of small dots of varying intensity according to the light and dark areas of the image. The dots, which are to be considered as small areas not necessarily round in shape, are produced on a photographic plate by making a photographic exposure through a light-transmitting screen, normally glass, which is divided into small squares by an intersecting pattern of fine lines, and a negative is thus obtained.

To improve the quality of the final print, it is often necessary to touch up at some stage in the process by filling in the areas between dots where dark areas are located and by removing highlight dots where light areas are located.

In colour television, the image may be transmitted in colour from a camera which contains three image orthicon tubes, the latter, by means of a system of mirrors and colour filters forming respective red, green, and blue images. Colour signals are then transmitted simultaneously, converted back into three separate colour images in three colour picture tubes, and then blended and superimposed into one picture. As an alternative to using three tubes, a shadow-mask tube may be used wherein a fluorescent screen composed of three separate sets of phosphor dots, which glow in a different colour, has a mask provided with holes aligned with the dots. Three electron guns produce separate beams which produce red, green and blue images, and the electrons discharged by each gun impinge only on the appropriate dots by virtue of the mask.

It is an object of the present invention to provide a light transmitting screen which obviates or mitigates the need, in printing, for retouching, and which, in colour television can replace the three picture tubes or the phosphor dot screen, shadow mask, etc., thus stabilising the picture and reducing the cost of manufacture.

According to the present invention there is provided a light-transmitting screen comprising a piece of transparent material having one face and a plurality of formations formed on said one face and defining a contoured surface, such that light incident on said contoured surface is refracted as it passes through the screen and any image being transmitted is broken up into a pattern of dots as hereinbefore defined, said formations adjoining one another such that said face is free of interstices.

Preferably, projections extending from said one face define said formations.

Alternatively, depressions in said one face define said formations.

The formations may be formed as triangular or square pyramids, the bases of which adjoin one another. Alternatively the formations may be of conical configuration, the bases partially intersecting one another.

An embodiment of the present invention will now be described by way of example with reference to the accompanying drawing which is a plan view of a screen according to the invention.

Referring to the drawing, a light-transmitting screen 10, formed from a sheet of transparent material, has a series of triangular pyramids 12 projecting from one face to define a contoured surface having points. The reverse face (not shown) has a planar surface. The bases 14 of the pyramids adjoin one another such that the pyramids cover the whole area of the screen without interstices. The triangular surfaces 16 of each pyramid are equal and equilateral.

In further embodiments (not shown) the screen has a series of square pyramids, the bases of which adjoin one another, or has conical projections, the bases of which partially intersect one another.

It is envisaged that the pyramidal or conical formations may be in the form of depressions in the surface of said one face. Also the triangular surfaces of each pyramid may be planar or may be of parabolic or part spherical arcuate form.

Light incident on the contoured surface of the screen is refracted as it passes through the screen and any image being transmitted is broken up into a pattern of dots.

It will be appreciated that each pyramidal formation on the screen can be used to form a single dot, e.g. with equilateral triangular surfaces, or three separate dots, e.g. with the triangular surfaces preferably at an angle of 26° to the base. When the screen is used in printing it is considered that 80 pyramidal projections to the inch may be a suitable dimension, but it is to be understood that this figure is given only by way of example. By reducing the amount of time occupied in retouching, the invention will effect much saving of time, expense and tedious work. The screen will also have a beneficial effect in the reproduction of light gradations and reduce the need for lens filters.

When used in colour television, it is envisaged that a screen with pyramidal formations will be appropriate, the triangular surfaces extending from the base of each pyramid being subtended at different angles. When an image in colour is being transmitted, red, green and blue are transmitted in different wavelengths and the triangular surfaces are so arranged that each is in sympathy with one of these wavelengths and passes only one of these colours.

The picture produced is more stable, the cost of manufacturing an appropriate tube would be reduced, and the receiver could be more compactly designed.

Various modifications may be made without departing from the scope of the invention. For example, the screen may be formed of two sheets of material, the other sheet having both surfaces planar and being attached to the contoured face of the first sheet to protect the latter and keep it clean.

I claim:

1. A stationary light-transmitting screen comprising a piece of transparent material having one face and a plurality of pointed formations formed on said one face and defining a contoured surface, such that light incident on said contoured surface is refracted as it passes through the screen and any image being transmitted is broken up into a pattern of dots by said formations, said formations adjoining one another such that said one face is free of interstices.

2. A screen according to claim 1, wherein projections extending from said one face define said formations.

3. A screen according to claim 1, wherein depressions in said one face define said formations.

4. A screen according to claim 1, wherein triangular pyramids form said formations and have bases which adjoin one another.

5. A screen according to claim 1, wherein square pyramids form said formations and have bases which adjoin one another.

6. A screen according to claim 4, wherein each pyramid has triangular surfaces which are equal and equilateral.

7. A screen according to claim 5, wherein each pyramid has triangular surfaces which are equal and equilateral.

8. A screen according to claim 4, wherein each pyramid has triangular surfaces subtended from its base at different angles to be in sympathy with the wavelengths of different colours being transmitted.

9. A screen according to claim 1, wherein said formations are of conical configuration, and have bases partially intersecting one another.

10. A screen according to claim 1, wherein the screen is formed from a single sheet and has a reverse face defined by a planar surface.

11. A screen formed from two sheets of transparent material, one sheet being a screen according to claim 1 and having a planar reverse face, and the other sheet having both faces planar, said other sheet being attached to said contoured surface of said one sheet.

12. For use with a photographic member, a stationary light transmitting screen comprising a piece of transparent material having one face and a plurality of pointed formations formed on said one face and defining a contoured surface, said screen being disposed with said one face remote from said photographic member such that light from an exposure arrangement is incident on said one face and is refracted as it passes through the screen to the photographic member, any image being transmitted being broken up into dots by said pointed formations, said formations adjoining one another such that said one face is free of interstices.

13. A method of transmitting an image onto a photographic member comprising the first step of disposing a light transmitting screen with one face remote from the member such that light from an exposure arrangement is incident on said one face and is refracted as it passes through the screen to the member, the screen having a plurality of pointed formations on said one face and defining a contoured surface, said formations adjoining one another such that said one face of interstices, and the second step of breaking up any image being transmitted onto the member into dots by said pointed formations.

* * * * *

UNITED STATES PATENT OFFICE
CERTIFICATE OF CORRECTION

Patent No. 4,114,982   Dated September 19, 1978

Inventor(s) Raymond Buckley

It is certified that error appears in the above-identified patent and that said Letters Patent are hereby corrected as shown below:

Column 4, line 23 "is free" should be inserted before --of--.

Signed and Sealed this

*Twenty-second* Day of *January 1980*

[SEAL]

*Attest:*

*Attesting Officer*

SIDNEY A. DIAMOND

*Commissioner of Patents and Trademarks*